US008028261B2

(12) United States Patent
Kwak

(10) Patent No.: US 8,028,261 B2
(45) Date of Patent: Sep. 27, 2011

(54) METHOD OF PREDICTING SUBSTRATE CURRENT IN HIGH VOLTAGE DEVICE

(75) Inventor: Sang-Hun Kwak, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 364 days.

(21) Appl. No.: 12/344,383

(22) Filed: Dec. 26, 2008

(65) Prior Publication Data

US 2009/0235211 A1 Sep. 17, 2009

(30) Foreign Application Priority Data

Dec. 26, 2007 (KR) .................. 10-2007-0137888

(51) Int. Cl.
*G06F 17/50* (2006.01)

(52) U.S. Cl. ............ 716/115; 716/54; 716/56; 716/100; 716/106; 716/133; 703/13; 703/14; 703/19

(58) Field of Classification Search .................. 716/50, 716/54, 56, 100, 106, 113, 115, 133; 703/13, 703/14, 19

See application file for complete search history.

(56) References Cited

U.S. PATENT DOCUMENTS

2003/0200071 A1* 10/2003 Zhang et al. .................... 703/15
2005/0203719 A1*  9/2005 Koike ............................. 703/2
2008/0054309 A1*  3/2008 Fang et al. .................... 257/213

OTHER PUBLICATIONS

"Analysis of Substrate Current and HCI Phenomena", by Mingzhi Dai, Xu Zeng, and Shaohua Liu, @2006 IEEE.*

* cited by examiner

*Primary Examiner* — Paul Dinh
*Assistant Examiner* — Nha Nguyen
(74) *Attorney, Agent, or Firm* — Sherr & Vaughn, PLLC

(57) ABSTRACT

A method of predicting a substrate current in a high voltage device that may accurately predict substrate current components in each of a first region, a second region, and a third region. This may be accomplished by modeling a substrate current component in a third region, in which an inconsistency may occur when a substrate current in a high voltage device is calculated, for example using BSIM3-based modeling. According to embodiments, a substrate current for a third region may be modeled by an expression with a ternary operator, and the modeled substrate current may be added to a substrate current obtained through BSIM3-based modeling.

7 Claims, 2 Drawing Sheets

METHOD OF PREDICTING SUBSTRATE CURRENT IN HIGH VOLTAGE DEVICE

The present application claims priority under 35 U.S.C. 119 to Korean Patent Application No. 10-2007-0137888 (filed on Dec. 26, 2007), which is hereby incorporated by reference in its entirety.

BACKGROUND

In a semiconductor integrated device, for example a metal-oxide semiconductor (MOS) transistor, a substrate current may be used and may represent a hot electron effect. A hot electron effect may be a phenomenon that, when electrons travel from a source region to a drain region through a channel region in a MOS transistor, an electric field applied to the electrons in a channel around an end of the drain region may be maximized, and kinetic energy of the electrons may be significantly increased. Some electrons may go beyond an energy barrier at an Si—SiO$_2$ interface and may intrude into an SiO$_2$ film. The electrons with significant energy may be called hot electrons. Electrons with high energy, which may be hot electrons, may cause impact ionization in a high-electric-field region of a drain junction while traveling. Because of impact ionization, secondary electron-hole pairs may be generated. Of these, the electrons may move toward a drain region and may increase a drain current. In addition, holes may move toward a substrate according to an electric field, and may form a substrate current. Therefore, the extent to which a hot electron effect may occur may be analyzed based on a substrate current. That is, an increase in substrate current may indicate that a hot electron effect in a MOS transistor may be relatively more pronounced. An increase in a substrate current may affect electrical characteristics of a MOS transistor. For example, in a CMOS circuit, various problems, such as noise or latch-up, may occur. For this reason, an error may occur if a circuit is operated.

FIG. 1 illustrates a change in a substrate current depending on a gate voltage in a state where a drain voltage $V_d$ in a related art MOS transistor may be maintained at 3.3 V, 2.75 V, and 2.2 V. Referring to FIG. 1, if a drain voltage in a related art transistor is maintained at a predetermined value or more, for example, when a drain voltage $V_d$ may be at 3.3 V, substrate current may initially increase depending on a gate voltage. In addition, substrate current may decrease after a certain peak point. A reason may be as follows.

Initially, if a gate voltage is applied, a drain current may increase, and a number of electrons for an impact ionization may increase. If a gate voltage becomes excessively high, a MOS transistor may operate from a saturation region to a linear region. Therefore, a vertical electric field at a pinch-off point in a channel may decrease. As a result, an impact ionization ratio may decrease. A substrate current may be an important factor that may affect reliability of a product and output resistance. Therefore, in developing a semiconductor device, it may be necessary to accurately understand and predict characteristics of a substrate current. In addition, as semiconductor devices become more highly integrated, a hot electron effect may become more pronounced. Therefore, in developing a highly integrated semiconductor device, it may be important to predict what characteristics a substrate current may have in a MOS transistor.

Characteristics of a substrate current in a device, including a MOS transistor, may be predicted by modeling based on impact ionization. Many programs may be commercially available and may predict a substrate current of a device, including a MOS transistor. For example, SPICE may be an example of a design program that may use Berkeley Short-channel IgFET Mode (BSIM3) to predict a substrate current. A BSIM3-based substrate current prediction model may not accurately predict a substrate current for a high voltage device, such as a high voltage MOS transistor. A high voltage MOS transistor may have sufficient capability to endure a high voltage that may be applied to its drain, and may be commonly used in various power devices.

A high voltage MOS transistor may have a lateral double diffused MOS (LDMOS) in which a drain region may be lightly impurity doped, which may maintain a stability of a drain from the high voltage, and which may extend laterally. Characteristics of a substrate current in a device including a high voltage MOS transistor may be different from those in a device including a related art transistor.

FIG. 2 illustrates characteristics of a substrate current depending on a gate voltage in a high voltage MOS transistor where a drain voltage $V_d$ may be maintained at 13.5 V, 11 V, 8.5 V, and 6 V. Referring to FIG. 2, in a high voltage device, if a drain voltage $V_d$ is initially at 1.5 V, if a gate voltage increases, a substrate current may also increase (first region, 200). A substrate current may start to decrease after a certain peak point (second region, 210). In first region and second region, a high voltage device may have substantially the same characteristics as a device including a related art MOS transistor. If a gate voltage further increases, a substrate current may increase again (third region, 220). Such a third region may not be observed in a device such as a related art MOS transistor. As a result, it may be impossible to accurately predict a behavior of a substrate current in a high voltage device by modeling according to the related art.

SUMMARY

Embodiments relate to a modeling method that may accurately predict a substrate current flowing through a substrate due to a hot electron effect in a high voltage device, including a high voltage MOS transistor.

Embodiments relate to a method which may accurately predict a substrate current in a high voltage device by adding a substrate current component ("additional substrate current") in a third region, which may be modeled with a ternary operator, to a substrate current obtained through BSIM3-based modeling.

According to embodiments, a method of predicting a substrate current in a high voltage device such as a high voltage transistor may include at least one of the following: determining whether or not a drain voltage is equal to or higher than a prescribed first critical value; setting an additional substrate current to zero if it is determined that the drain voltage is lower than the first critical value; determining whether or not a gate voltage is equal to or higher than a prescribed second critical value if it is determined that the drain voltage is equal to or higher than the first critical value; setting an additional substrate current to zero if it is determined that the gate voltage is lower than the second critical value; setting an additional substrate current to a value obtained by multiplying a second power of a difference between the first critical value and the gate voltage, the drain voltage, and a proportional constant if it is determined that the gate voltage is lower than the second critical value; and then adding the additional substrate current to a substrate current obtained through BSIM3-based modeling.

According to embodiments, a method may include at least one of the following: determining whether a drain voltage of a device is equal to or higher than a prescribed first critical value; and then setting an additional substrate current to zero if the drain voltage is lower than the first critical value; and then determining whether a gate voltage is equal to or higher than a prescribed second critical value if the drain voltage is equal to or higher than the first critical value; and then setting the additional substrate current to zero if the gate voltage is lower than the second critical value; and then setting the additional substrate current to a value obtained by multiplying a second power of a difference between the first critical value and the gate voltage, the drain voltage, and a proportional constant if the gate voltage is equal to or greater than the second critical value; and then adding the additional substrate current to a substrate current obtained through MOSFET device modeling.

According to embodiments, a method may include at least one of the following: setting a first critical value of a device; and then multiplying a second power of a difference between the first critical value and a gate voltage, a drain voltage, and a proportional constant to obtain an additional substrate current; and then adding the additional substrate current to a substrate current obtained through MOSFET device modeling.

According to embodiments, characteristics of a substrate current in a high voltage MOS transistor, which may not be predicted through a related art BSIM3-based modeling, may be predicted. Therefore, for new device design, relatively more accurate information may be provided. In addition, it may not be necessary to manufacture a device to detect a substrate current. As a result, costs and time required for product development may be reduced.

DRAWINGS

Figure 3:
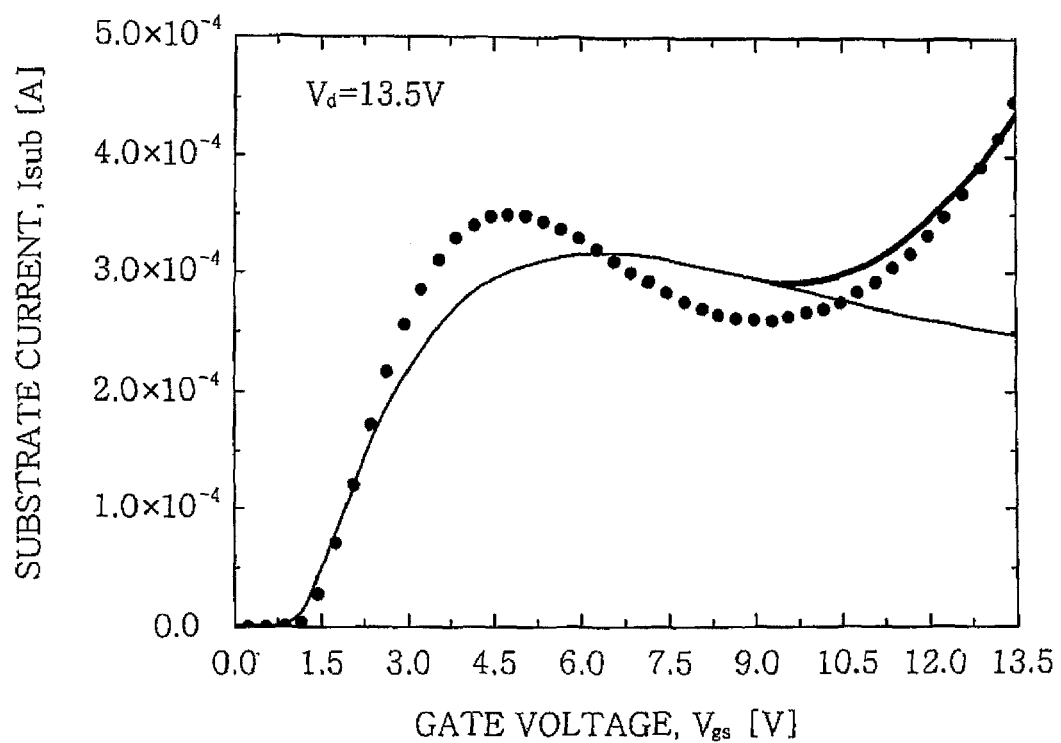

Example FIG. 3 illustrates a comparison result of a substrate current by a substrate current prediction model according to embodiments and a measurement value.

DESCRIPTION

According to embodiments, there may be provided a method of predicting a substrate current in a high voltage device which may accurately predict substrate current components in a first region, a second region, and a third region. This may be accomplished by modeling a substrate current component in a third region, in which inconsistency may occur when a substrate current in a high voltage device is calculated by a modeling of predicting substrate current, e.g., BSIM3-based modeling, by an expression with a ternary operator. The modeled substrate current may then be added to a result of BSIM3-based modeling.

According to embodiments, a ternary operator may be expressed by Expression 1.

(Condition; Value 1: Value 2)     (Expression 1)

This expression may return a value 1 if a condition is true and may return a value 2 if a condition is false. According embodiments, an additional substrate current may be expressed by Expression 2 with the ternary operator.

$(V_d \geq V_{crt}); \{[V_g \geq V_{gturn}; a \times V_d \times (V_g - V_{gturn})^2:0]:0\}$     (Expression 2)

Figure 1:
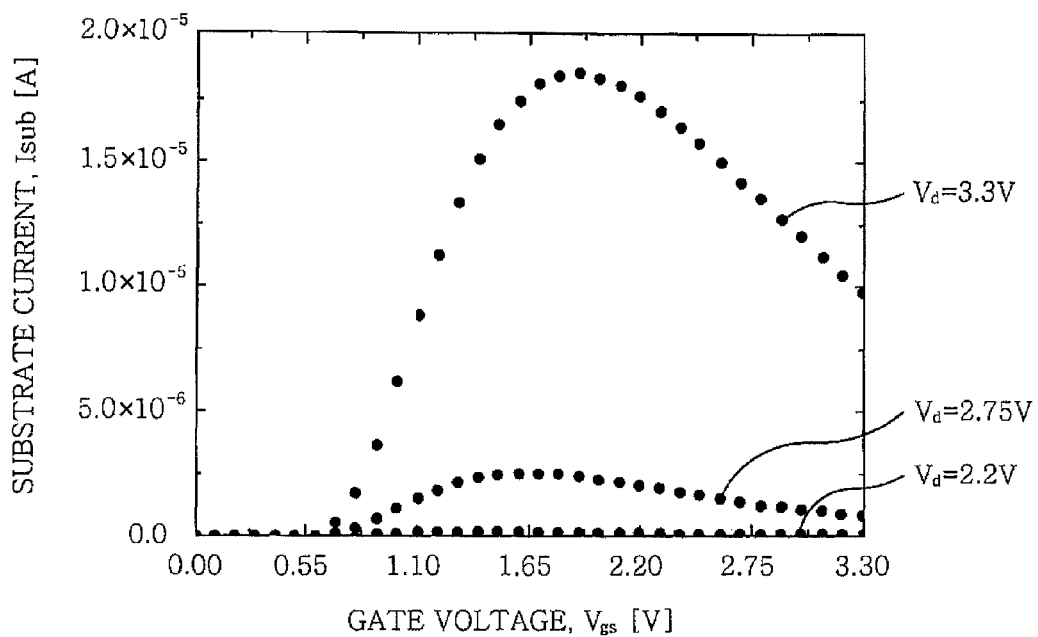
FIG. 1 illustrates a change in a substrate current depending on a gate voltage at a given drain voltage in a MOS transistor.
Figure 2:
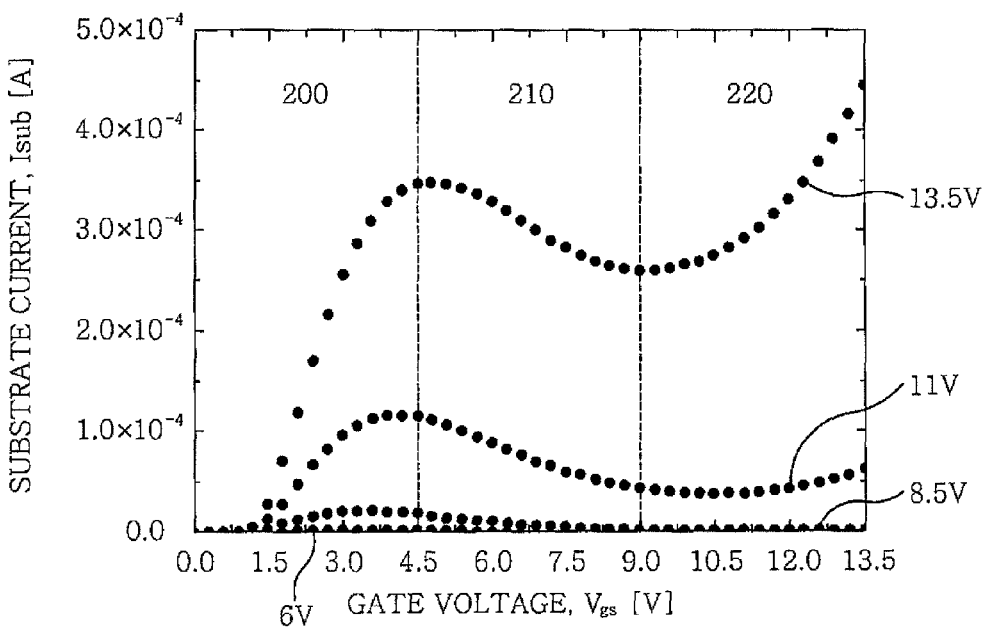
FIG. 2 illustrates a change in a substrate current depending on a gate voltage at a given drain voltage in a high voltage MOS transistor.

$V_d$: drain voltage
$V_g$: gate voltage
$V_{crt}$: drain voltage on a condition that a change in a substrate current appears depending on a gate voltage $V_{gturn}$: gate voltage when a decreasing substrate current starts to increase
a: proportional constant This expression will now be described, according to embodiments. First, it may be determined whether a drain voltage is equal to or higher than a predetermined critical value $V_{crt}$ ("first critical value"). According to embodiments, as shown in FIG. 2, if a drain voltage is lower than 8.5 V (for example, a drain voltage of 6 V), even if the gate voltage increases, no change in a substrate current may appear. According to embodiments, 8.5 V may become a first critical value $V_{crt}$. If drain voltage $V_d$ becomes less than 8.5 V as a first critical value, an additional substrate current may be set to zero. According to embodiments, if drain voltage $V_d$ becomes equal to or greater than 8.5 V, the process may proceed.

According to embodiments, it may be determined whether or not the gate voltage is equal to or higher than a prescribed critical value $V_{gturn}$ ("second critical value"). According to embodiments, as shown in FIG. 2, if a gate voltage increases to be equal to or higher than a predetermined voltage, there may appear a region where a decreasing substrate current may increase again (that is, the third region). At a point in time when a substrate current may increase again, a gate voltage may become a second critical value. According to embodiments, if a gate voltage is lower than a second critical value, an additional substrate current may be set to zero.

According to embodiments, if a gate voltage is equal to or higher than a second critical value, an additional substrate current may be set by Expression 2. Expression 2 may be used to model characteristics of a substrate current in a high voltage MOS transistor. According to embodiments, a substrate current may be proportional to a product of a second power of a difference between a second critical value and a gate voltage, and a drain voltage $V_d$. According to embodiments, in Expression 2, a proportional constant a may be obtained through a preliminary experiment or process, which may be performed in advance, by device. According to embodiments, proportional constant may be listed or provided in a database.

According to embodiments, if an additional substrate current is obtained, the process may proceed. According to embodiments, an additional substrate current may be added to a substrate current calculated based on BSIM3 according to the related art. A substrate current calculated based on BSIM3 according to the related art may be consistent with a substrate current in a first and second region of FIG. 2, but may be inconsistent with a substrate current in a third region. A substrate current component obtained according to embodiments may be consistent with a substrate current component in a third region. According to embodiments, by adding an additional substrate current to a substrate current obtained by modeling according to the related art, behaviors of a substrate current in all regions may be predicted.

Example FIG. 3 illustrates a comparison result of a substrate current by a simulation according embodiments and an actual substrate current. As for parameters used in a simulation, drain voltage may be 13.5 V, first critical value may be 10 V, and second critical value may be 9 V. According to embodiments, proportional constant 'a' may be $7e^{-7}$. Referring to example FIG. 3, a substrate current may not be accurately predicted by a related art BSIM3-based modeling in a third region. According to embodiments, a substrate current may be more accurately predicted as described above.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method to utilize a computer to predict a substrate current in a device, comprising:
    determining whether a drain voltage of the device is equal to or higher than a prescribed first critical value; and then
    setting an additional substrate current of the device to zero if the drain voltage is lower than the first critical value; and then
    determining whether a gate voltage of the device is equal to or higher than a prescribed second critical value if the drain voltage is equal to or higher than the first critical value; and then
    setting the additional substrate current to zero if the gate voltage is lower than the second critical value; and then
    setting, by using the computer, the additional substrate current to a value obtained by multiplying a second power of a difference between the second critical value and the gate voltage, the drain voltage, and a proportional constant if gate voltage is equal to or greater than the second critical value; and then
    adding the additional substrate current to a substrate current of the device obtained through MOSFET device modeling,
    wherein the first critical value is set to the drain voltage when a change in the substrate current appears, depending on the gate voltage, and
    wherein the second critical value is set to the gate voltage when a decreasing substrate current starts to increase.

2. The method of claim 1, wherein the MOSFET device modeling comprises Berkeley Short-channel IgFET Mode (BSIM3)-based modeling.

3. The method of claim 1, wherein the first critical value is approximately 8.5V.

4. The method of claim 1, wherein the second critical value is less than the first critical value.

5. The method of claim 1, wherein the additional substrate current is determined by the expression $((a) \times (V_d) \times (V_g - V_{gturn})^2)$, wherein $V_d$ is the drain voltage, $V_g$ is the gate voltage, $V_{gturn}$ is the gate voltage when a decreasing substrate current starts to increase, and "a" is the proportional constant.

6. The method of claim 1, wherein the proportional constant is obtained through a preliminary process and listed in a database.

7. The method of claim 1, wherein the proportional constant is approximately $7e^{-7}$.

* * * * *